(12) United States Patent
Chang et al.

(10) Patent No.: US 10,854,542 B2
(45) Date of Patent: Dec. 1, 2020

(54) VIA STRUCTURE AND METHODS THEREOF

(71) Applicant: Taiwan Semiconductor Manufacturing Co., Ltd., Hsin-Chu (TW)

(72) Inventors: Che-Cheng Chang, New Taipei (TW); Chih-Han Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/713,862

(22) Filed: Dec. 13, 2019

(65) Prior Publication Data

US 2020/0118923 A1  Apr. 16, 2020

Related U.S. Application Data

(62) Division of application No. 15/964,276, filed on Apr. 27, 2018, now Pat. No. 10,727,178.

(Continued)

(51) Int. Cl.
| | |
|---|---|
| *H01L 23/522* | (2006.01) |
| *H01L 23/528* | (2006.01) |
| *H01L 21/768* | (2006.01) |
| *H01L 21/311* | (2006.01) |
| *H01L 27/088* | (2006.01) |
| *H01L 21/8234* | (2006.01) |

(Continued)

(52) U.S. Cl.
CPC ...... *H01L 23/5226* (2013.01); *H01L 21/0276* (2013.01); *H01L 21/2885* (2013.01); *H01L 21/31116* (2013.01); *H01L 21/31144* (2013.01); *H01L 21/76802* (2013.01); *H01L 21/76843* (2013.01); *H01L 21/76877* (2013.01); *H01L 21/823475* (2013.01); *H01L 23/5283* (2013.01); *H01L 23/53238* (2013.01); *H01L 23/53295* (2013.01); *H01L 27/088* (2013.01); *H01L 21/3212* (2013.01); *H01L 21/7684* (2013.01); *H01L 29/0649* (2013.01)

(58) Field of Classification Search
CPC ........... H01L 23/5226; H01L 23/53295; H01L 21/76832; H01L 21/11582; H01L 21/76802; H01L 21/76834; H01L 27/11556
See application file for complete search history.

(56) References Cited

U.S. PATENT DOCUMENTS

| | | |
|---|---|---|
| 5,161,093 A | 11/1992 | Gorczyca et al. |
| 8,772,109 B2 | 7/2014 | Colinge |
| | (Continued) | |

*Primary Examiner* — Zandra V Smith
*Assistant Examiner* — John M Parker
(74) *Attorney, Agent, or Firm* — Haynes and Boone, LLP

(57) ABSTRACT

A method includes providing a substrate, wherein the substrate includes a conductive feature in a top portion of the substrate; forming a buffer layer over the substrate; forming a dielectric layer over the buffer layer; performing a first etching process to form an opening in the dielectric layer, thereby exposing a top surface of the buffer layer; and performing a second etching process to extend the opening downwardly into the buffer layer, thereby exposing a top surface of the conductive feature, wherein the performing of the second etching process includes laterally enlarging a footing profile of the opening.

20 Claims, 16 Drawing Sheets

Related U.S. Application Data

(60) Provisional application No. 62/585,684, filed on Nov. 14, 2017.

(51) Int. Cl.
*H01L 21/288* (2006.01)
*H01L 23/532* (2006.01)
*H01L 21/027* (2006.01)
*H01L 21/321* (2006.01)
*H01L 29/06* (2006.01)

(56) References Cited

U.S. PATENT DOCUMENTS

| | | |
|---|---|---|
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,515,021 B1 | 12/2016 | Chen et al. |
| 9,520,482 B1 | 12/2016 | Chang et al. |
| 9,576,814 B2 | 2/2017 | Wu et al. |
| 9,761,488 B2 | 9/2017 | Cheng et al. |
| 2007/0040188 A1 | 2/2007 | Tsai et al. |
| 2009/0289369 A1* | 11/2009 | Fang ................ H01L 21/76816 257/758 |
| 2010/0078771 A1 | 4/2010 | Barth et al. |
| 2012/0322238 A1 | 12/2012 | Lei et al. |
| 2014/0197538 A1 | 7/2014 | Lu et al. |
| 2016/0111325 A1 | 4/2016 | JangJian et al. |
| 2017/0194242 A1 | 7/2017 | Huang et al. |
| 2017/0278742 A1 | 9/2017 | Chen et al. |
| 2018/0097173 A1 | 4/2018 | Chuang et al. |

* cited by examiner

VIA STRUCTURE AND METHODS THEREOF

PRIORITY

This is a divisional application of U.S. patent application Ser. No. 15/964,276, filed on Apr. 27, 2018, which claims priority to U.S. Provisional Pat. App. Ser. No. 62/585,684 filed on Nov. 14, 2017, the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

As the size of integrated circuit becomes smaller and the density of devices on integrated circuit chips increases, laying out integrated circuit as three-dimensional structures has been shown to significantly reduce the communication path length between on-chip components, provided the vertical distances between the layers are much smaller than the chip width of the individual layers. Vias have been widely used in semiconductor fabrication to provide electrical coupling vertically between the layers. The size of vias typically scales down to match the scaling down of other components and devices on integrated circuit chips. The minimum cross-sectional area of a via is important to ensure that the via does not have too much resistance to current flow. Using conventional methods of via formation, sidewalls of a via may have a smooth slope profile, such that the cross-sectional area of a via is smallest at its bottom. The reduced cross-sectional area will cause increased electrical resistance through a via. Further, the reduced cross-sectional area may cause the bottom critical dimension of a via to shrink to unacceptable sizes, which may even cause an open circuit. Such problems can also be disastrous on production yield. Similar problems may be found in other interconnect structures, not limited to vias, such as conductive features formed in trenches. Therefore, although existing approaches in via or trench formation have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
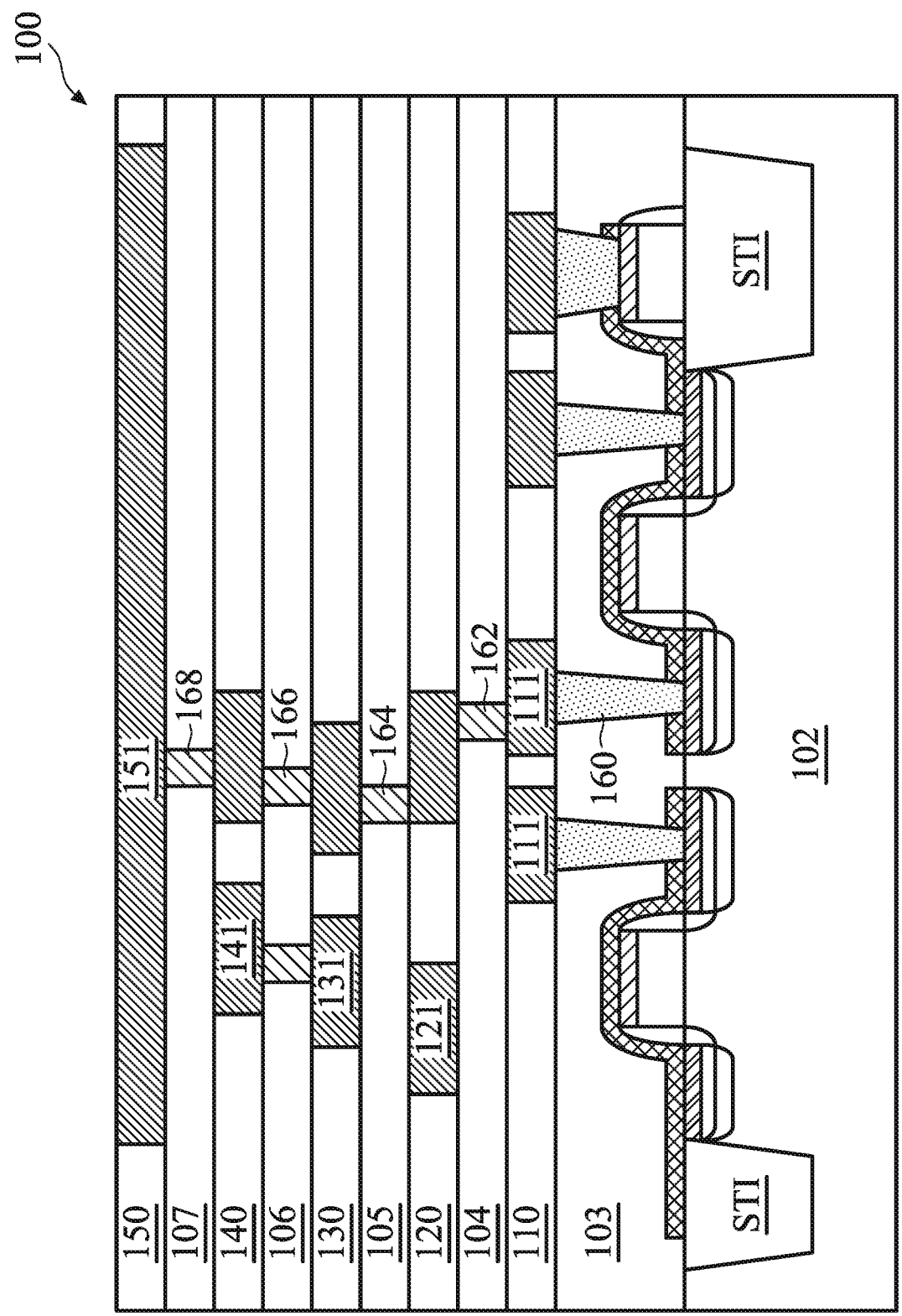
FIG. 1 illustrates an embodiment of various metal layers formed in an integrated circuit (IC).

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices and methods of forming the same. More particularly, the present disclosure is related to providing via structures or trench structures with enlarged bottom footing profile and methods thereof. The enlarged bottom footing profile of conductive features filled in via holes or trenches ensures that the conductive features do not exhibit too much resistance to a current flow, and also strengthens the conductive features' bonding to lower metal with larger bottom contact areas.

A via or a trench of an embodiment of the present disclosure may have any suitable shape in a top view. In an exemplary top view, a trench may have a generally rectangular shape and a via may have a generally elliptical shape, but they can be of other suitable shapes, such as a round shape, a rhombus shape, an L shape, or a rectangular shape. As used herein, the term "via" is used broadly to include via plug, wire or trace structure, contact plug, as well as any conductive structure formed using damascene and/or dual damascene processes.

FIG. 1 is an illustrative integrated circuit (IC) 100 comprising individual devices, such as transistors, capacitors, or the like, formed on a substrate layer 102. One or more dielectric material layers 110, 120, 130, 140, and 150 are then formed over the substrate layer 102 to provide connections among the individual devices and to provide connections to external devices. The dielectric material layer 110 includes conductive features 111 embedded therein. On top of the substrate layer 102 is a layer 103 which is an inter-layer dielectric (ILD) layer between the conductive features 111 and the substrate layer 102. The conductive features 111 are connected to the devices within the substrate layer 102 by vias 160 through the ILD layer 103. Similarly, additional dielectric material layers 120, 130, 140, and 150 are formed on top of each other and separated by dielectric material layers 104, 105, 106, and 107, respectively. The dielectric material layers 120, 130, 140, and 150 include conductive features 121, 131, 141, and 151, respectively. The dielectric material layers 104, 105, 106, 107 include vias 162, 164, 166, and 168, respectively, which electrically connect the conductive features 111, 121, 131, 141, and 151. The conductive features 111, 121, 131, 141, and 151 may be referred to as metal layers $M_x$ (x=1, 2, 3 . . . ). The dielectric material layers 104, 105, 106, 107, 110, 120, 130, 140, and 150 are also referred to as inter-metal dielectric (IMD) layers. The number of IMD layers is only for illustrative purposes and are not limiting.

The substrate layer 102 is the bottom layer where a plurality of drain and source regions of transistors may be formed. The substrate layer 102 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

The substrate layer 102 may comprise electrical devices such as various N-type metal-oxide semiconductor (NMOS) and/or P-type metal-oxide semiconductor (PMOS) devices, planar transistors, multi-gate transistors such as FinFET devices, gate-all-around (GAA) devices, Omega-gate (Ω-gate) devices, or Pi-gate (Π-gate) devices, other transistors, capacitors, resistors, diodes, photo-diodes, fuses, and the like, interconnected to perform one or more functions. Shallow trench isolation (STI), or other isolation structures, may also be formed in substrate 102 to isolate device regions. STI may be formed by etching the substrate layer 102 using photolithography techniques to form recesses. The recesses are then filled with a dielectric material such as an oxide layer. A chemical mechanical polishing (CMP) process may be performed to planarize the surface of the substrate layer 102.

The ILD layer 103 is formed over the substrate layer 102. The ILD layer 103 may comprise a low-k dielectric material (e.g., k value less than about 3.0). For example, the ILD layer 103 may comprise an oxide, $SiO_2$, borophosphosilicate glass (BPSG), TEOS, spin-on glass (SOG), undoped silicate glass (USG), fluorinated silicate glass (FSG), high-density plasma (HDP) oxide, or plasma-enhanced TEOS (PE-TEOS).

The IMD layers 110 to 150, as illustrated in FIG. 1, may include conductive features containing conductive material compositions, such as highly-conductive metal, low-resistive metal, elemental metal, transition metal, or the like. In an embodiment the conductive features in each IMD layer may be formed of copper, although other materials, such as tungsten, aluminum, gold, or the like, could alternatively be utilized. Copper has a more desirable thermal conductivity and is available in a highly pure state. In an embodiment in which the conductive features are formed of copper, the conductive features may be deposited by electroplating techniques, although any method of formation could alternatively be used.

Copper is difficult to etch and achieve a precise pattern. When the conductive material is copper, the conductive features may be formed, using a plating and etching process through a damascene or dual-damascene process, in which openings are etched into the corresponding dielectric layer and the openings are subsequently filled with copper. The damascene process means formation of a patterned layer embedded on and in another layer such that the top surfaces of the two layers are coplanar. An IMD layer is deposited either directly on a substrate, or on top of an existing metal layer. Once the IMD layer is deposited, portions of the IMD may be etched away to form recesses, such as trenches and via holes, which can connect different regions of the IC and accommodate the conductive lines. A damascene process which creates either wires or vias (but not both) is known as a single damascene process. A damascene process which creates both trenches and vias at once is known as a dual damascene process. Damascene and dual-damascene processes use lower resistance metals such as copper to form many metal elements (e.g. lines, interconnects, and the like) instead of the conventionally used aluminum.

Using conventional methods of forming a via hole, often an anisotropic etch of the ILD layer is performed to provide a smooth slope for the via hole profile. Although this smooth slope may be beneficial for other processing reasons, for example, maintaining critical dimensions for upper portion of via hole, and/or more uniform coverage of hole surfaces by barrier layer using physical vapor deposition (PVD), etc., the reduced cross-sectional area near the bottom of the via will cause increased electrical resistance through the via. As a result, the cross-section area of the via is smallest where it connects to the substrate layer (which in this case is the substrate where source/drain terminals are formed) due to the tapered profile of the via sidewall. Landing area of a contact is often critical to control resistance across the connection at the contact bottom. When a conductor on one level does not sufficiently match up with a conductor on a level below, the connection point may become smaller causing a higher resistance at the point of connection or the connection may not even be made, causing an open circuit and impacting wafer acceptance test (WAT). As a comparison, still referring to FIG. 1, interconnections between different conductive features 111, 121, 131, 141, and 151, and between conductive feature 111 and substrate layer 102 are made by vias, such as the vias 160, 162, 164, 166, and 168, which are substantially similar to the via structures to be described later in FIG. 2A. These vias have enlarged bottom footing profile and allow for electrical connection between interconnects of metal layers (or directly with the semiconductor devices in the substrate) with better contacts and less resistance.

Figure 2A:
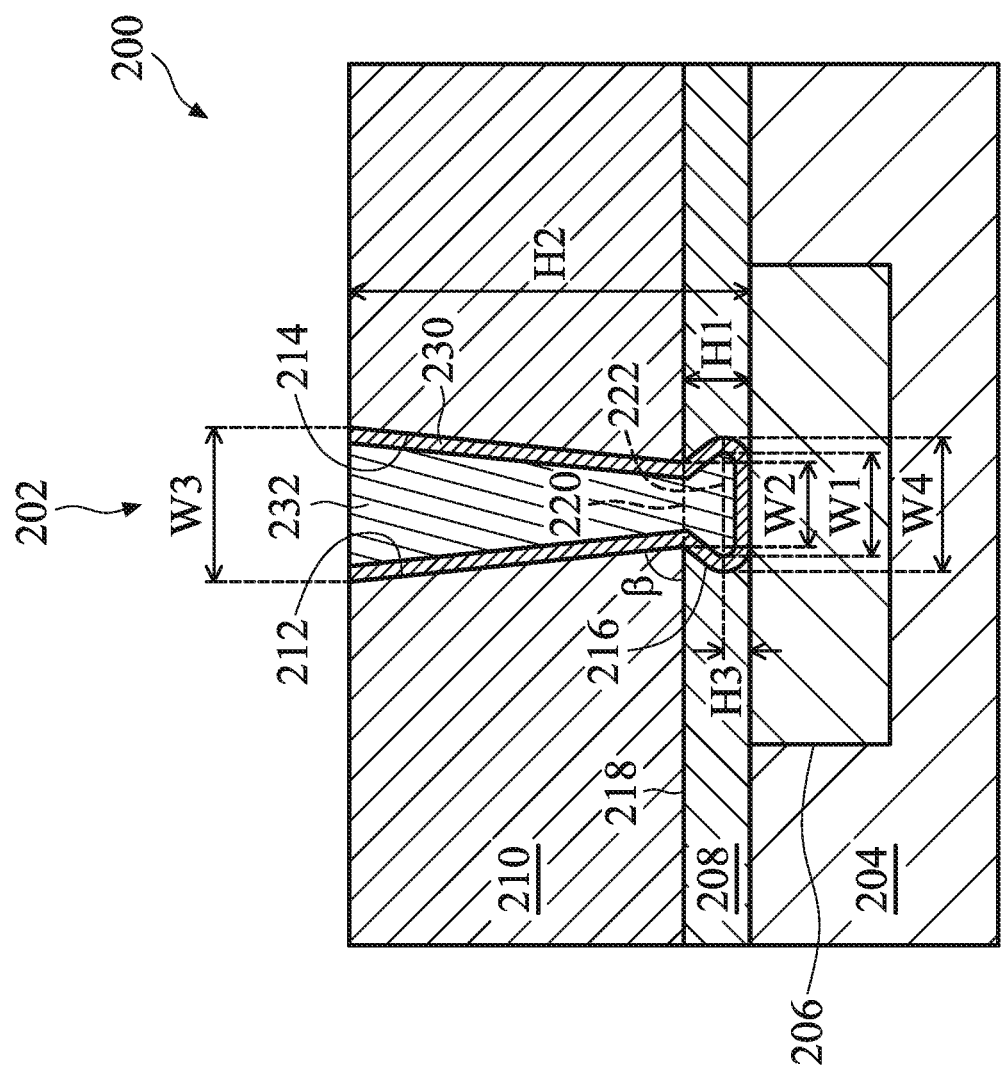
FIGS. 2A, 2B, and 2C illustrate via structures with enlarged bottom footing profile, in accordance with some embodiments of the present disclosure.

FIG. 2A illustrates a portion of a semiconductor device 200 with a via 202 formed in accordance with an illustrative embodiment of the present disclosure. In one embodiment, the underlying layer 204 may be an IMD layer having a conductive feature 206 (e.g., a copper line) formed therein. In another embodiment, the underlying layer 204 may be substantially similar to the semiconductor layer 102 in FIG.

1 and the conductive feature 206 may be part of a transistor, such as a gate terminal, a source terminal, or a gate terminal. A buffer layer 208 is formed on the underlying layer 204. As will be shown later in more details, during semiconductor fabrication, the buffer layer 208 functions as an etch stop layer. Therefore, the buffer layer 208 may also be referred to as an etch stop layer 208. In one embodiment, the buffer layer 208 may be a single layer with continuous material composition, such as silicon nitride, silicon oxynitride, silicon carbide, titanium nitride, other suitable materials, or combination thereof. In some embodiments, the buffer layer 208 includes an aluminum-containing layer, such as aluminum nitride, aluminum oxide, other suitable materials, or combination thereof. In another embodiment, the buffer layer 208 may include a number of sub-layers, such as two sub-layers including an aluminum nitride layer and an aluminum oxide layer, or an aluminum nitride layer and an aluminum oxynitride ($Al_xO_yN_z$) layer, or three sub-layers including an aluminum nitride layer, an oxygen-doped silicon carbide (ODC) layer in the middle, and an aluminum oxide layer. A dielectric layer 210 is formed over the buffer layer 208. The dielectric layer 210 may be a low-k dielectric layer including dielectric material with k value less than about 3.0, such as $SiO_2$, SOG, BPSG, TEOS, HDP oxide, USG, doped oxide, FSG with k in a range of about 1.2 to about 3.0, any suitable low dielectric constant material, or combinations thereof.

A via hole 212 is formed in and extends through the dielectric layer 210 and the buffer layer 208. The via hole 212 exposes the conductive feature 206 of the underlying layer 204. The via hole 212 includes an upper portion 214 surrounded by the dielectric layer 210 and a lower portion 216 surrounded by the buffer layer 208. In various embodiments, a ratio between a height of the lower portion 216 and a height of the upper portion 214 ranges from about 5% to about 10%, such as about 8% in a specific embodiment. As an example, the lower portion 216 may have a height H1 ranging from about 1 nm to about 10 nm; and the via hole 212 may have a height H2 ranging from about 15 nm to about 200 nm.

The upper portion 214 has a tapered profile with an angle β formed between its sidewall and a top surface 218 of the buffer layer 208. In some embodiments, the angle β is within a range from about 75 degrees to about 85 degrees. In some embodiments, the angle β is larger than 85 degrees or around 90 degrees, such that the sidewall can be regarded as substantially perpendicular to the top surface 218 of the buffer layer 208. The lower portion 214 has a sidewall that discontinues the otherwise smooth tapering of the upper portion 214 and extends outwardly. At least part of the lower portion 216 of the via hole 212 has a larger cross-sectional area than the smallest cross-sectional area of the upper portion 214 of the via hole 212. In this embodiment, the cross-sectional plane at the discontinuity point is where the via hole 212 has the smallest cross-sectional area, denoted as cross-sectional plane 220, which may also be considered as where the upper portion 214 interfaces with the lower portion 216. In the illustrated embodiment of FIG. 2A, the cross-sectional plane 220 is substantially coplanar with the top surface 218 of the buffer layer 208.

The width W1 of the bottom opening of the via hole 212 may range from about 10 nm to about 100 nm; the width W2 of the cross-sectional plane 220 may range from about 8 nm to about 90 nm; the width W3 of the top opening of the via hole 212 may range from about 12 nm to about 250 nm. In one embodiment, the ratio between W3:W2:W1 is about 1.5:1:1.25. In another embodiment, the ratio between W3:W2:W1 is about 2.5:1:1.5. In a specific embodiment, W1 may be even larger than W3, and the ratio between W3:W2:W1 may be about 1.2:1:1.3.

In some embodiments, the lower portion 216 has a rounded corner, such that the lower portion 216 has its largest cross-sectional area located at a cross-sectional plane 222 above the bottom opening of the via hole 212. In some embodiments, the distance H3 from the cross-sectional plane 222 to the bottom opening of the via hole 212 is about 10% to about 30% of H1, such as about 20% of H1. In one example, H3 is in a range from about 2 nm to about 5 nm. In some embodiments, the width W4 of the cross-sectional plane 222 is about 5% to about 10% larger than W1, such as about 6% larger than W1. In one example, W4 is about 1 nm to about 5 nm larger than W1.

In the present embodiment, a conductive and substantially conformal barrier layer 230 covers substantially all surfaces of the dielectric layer 210 and the buffer layer 208 in the via hole 212. The barrier layer 230 may include any suitable barrier layer material, such as Ti, Ta, TiN, TaN, alloys thereof, or combinations thereof. Although not shown, any number of intervening layers may be formed between the barrier layer 230 and the dielectric layer 210 and/or the buffer layer 208. A conductive material 232 is formed in the via hole 212 over the barrier layer 230. The conductive material 232 may be any suitable conductive material, including tungsten, copper, aluminum, titanium, tantalum, gold, alloys thereof, composites thereof, or combinations thereof. Although not shown, any number of intervening layers may be formed between the barrier layer 230 and the conductive material 232.

Figure 2C:
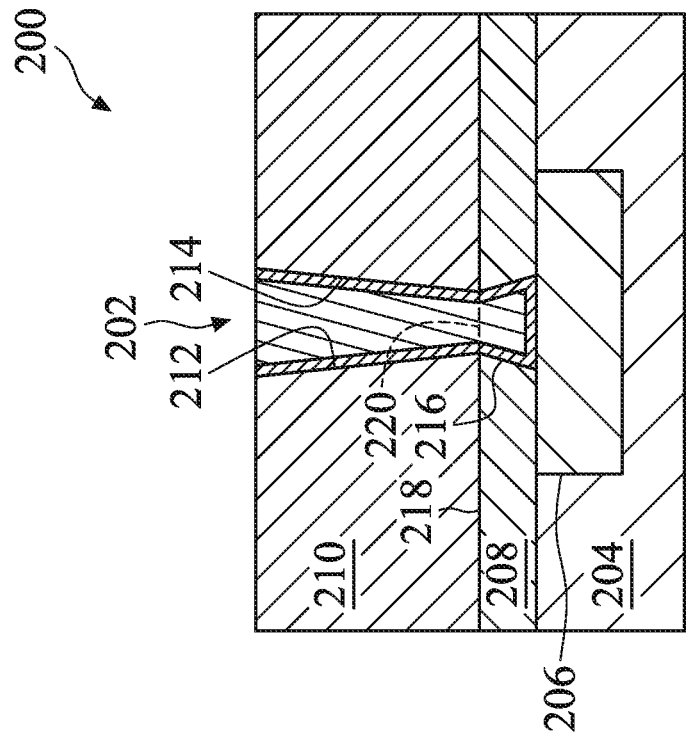
Figure 2B:
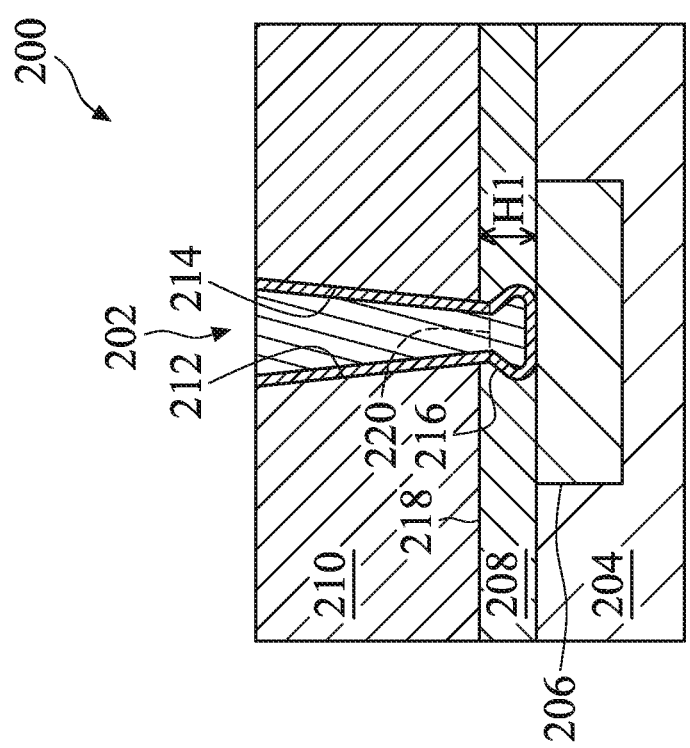

FIGS. 2B and 2C illustrate various other embodiments of the via 202. In FIG. 2B, the cross-sectional plane 220 where the smallest cross-sectional area of the via hole 212 is located is below the top surface 218 of the buffer layer 208. Therefore, the tapered slope of the upper portion 214 extends into the buffer layer 208. In some embodiments, the cross-sectional plane 220 is below the top surface 218 for about 10% to about 60% of H1, such as about 30% of H1. The forming of the tapered slope of the upper portion 214 into the buffer layer 208 can be implemented by anisotropic etching partially into the buffer layer 208, then followed by an isotropic etching or a lateral etching to enlarge the bottom footing profile. In FIG. 2C, the lower portion 216 has a tapered slope extending outwardly. The largest cross-sectional area of the lower portion 216 is at the bottom opening of the via hole 212. The cross-sectional plane 220 may be substantially coplanar with the top surface 218 or below the top surface 218 in the embodiment shown in FIG. 2C.

Figure 3:
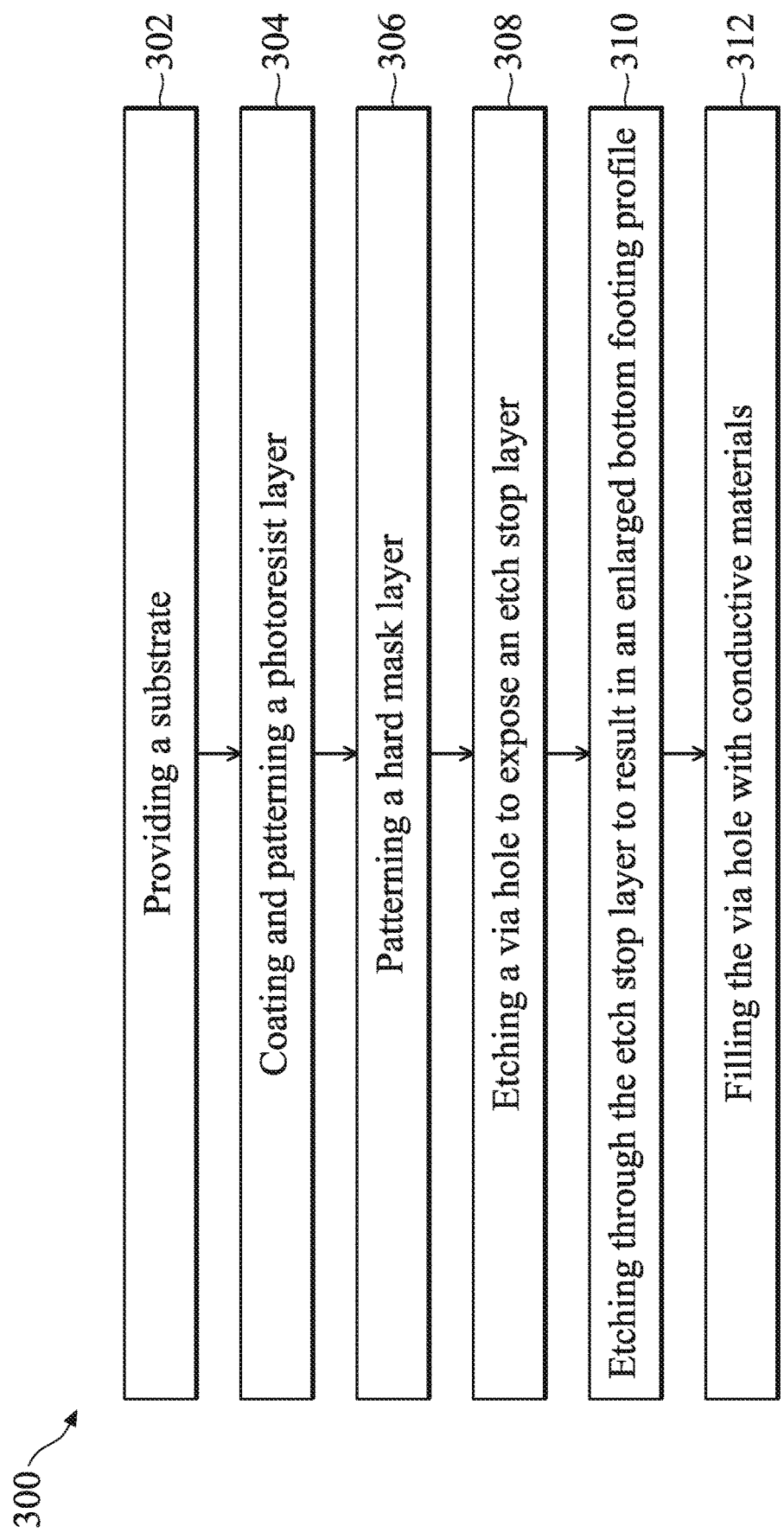
FIG. 3 shows a flow chart of a method of forming vias with enlarged bottom footing profile, according to various aspects of the present disclosure.

FIG. 3 illustrates a flow chart of a method 300 for forming semiconductor devices according to the present disclosure. The method 300 is an example, and is not intended to limit the present disclosure beyond what is explicitly recited in the claims. Additional operations can be provided before, during, and after the method 300, and some operations described can be replaced, eliminated, or relocated for additional embodiments of the method. The method 300 is described below in conjunction with FIGS. 4-11, which illustrate cross-sectional views of a device 400 during various fabrication steps according to some embodiments of the method 300.

The device 400 may be an intermediate device fabricated during processing of an integrated circuit (IC), or a portion thereof, that may comprise static random access memory (SRAM) and/or logic circuits, passive components such as resistors, capacitors, and inductors, and active components such as p-type FETs (pFETs), n-type FETs (nFETs), Fin- FETs, metal-oxide semiconductor field effect transistors (MOSFET), and complementary metal-oxide semiconductor (CMOS) transistors, bipolar transistors, high voltage transistors, high frequency transistors, other memory cells, and combinations thereof. Furthermore, the various features including transistors, gate stacks, active regions, isolation structures, and other features in various embodiments of the present disclosure are provided for simplification and ease of understanding and do not necessarily limit the embodiments to any types of devices, any number of devices, any number of regions, or any configuration of structures or regions.

Figure 4:
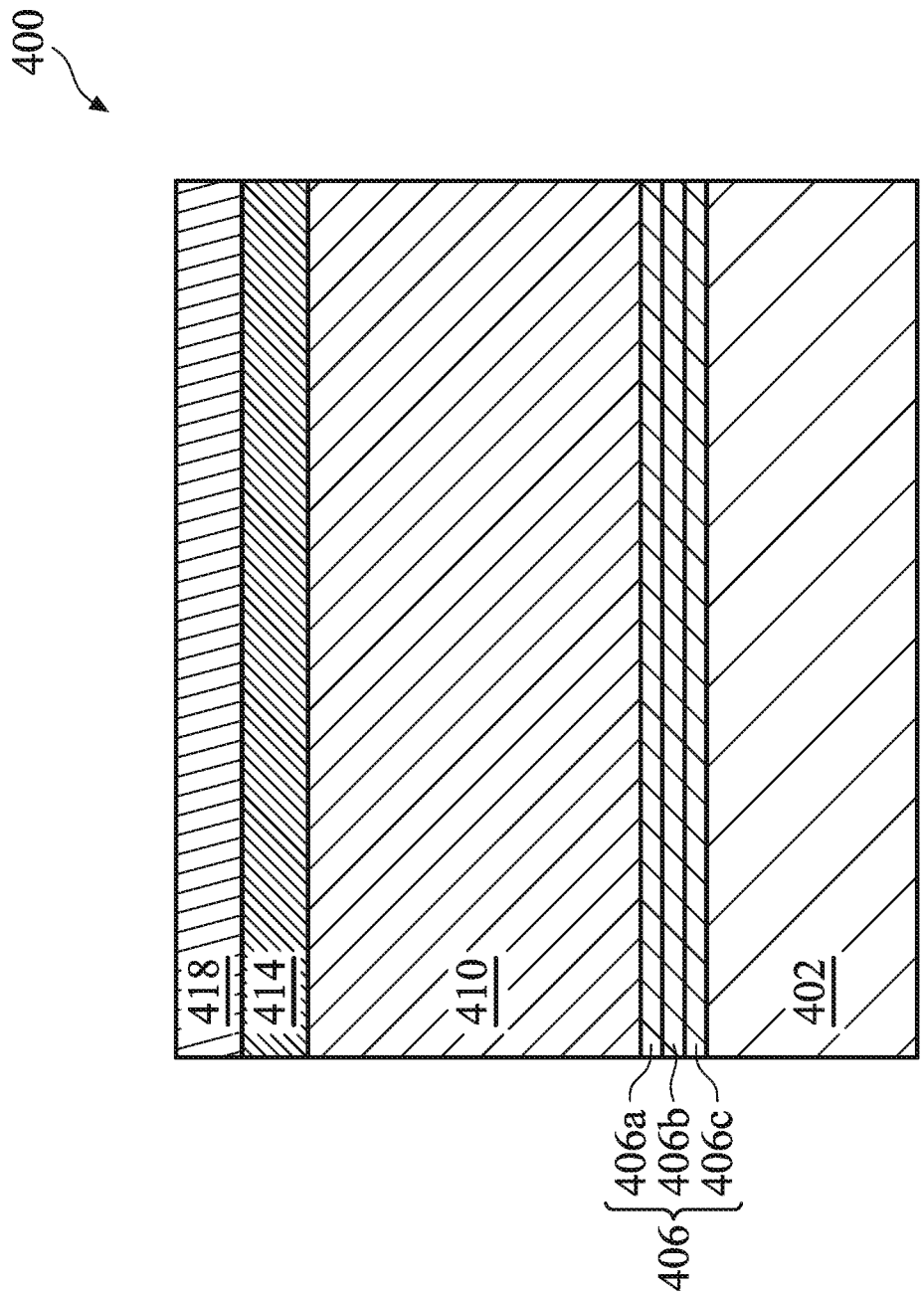
FIGS. 4, 5, 6, 7, 8A, 8B, 8C, 9, 10, 11, 12, and 13 illustrate a portion of a semiconductor device during a fabrication process according to the method of FIG. 3, in accordance with some embodiments of the present disclosure.

At operation 302, the method 300 (FIG. 3) provides a device 400 (FIG. 4). The device 400 may include an underlying layer 402 and various features formed therein. In one embodiment, the underlying layer 402 may be an IMD layer that is substantially similar to one of the IMD layers 110, 120, 130, 140, and 150 illustrated in FIG. 1. Alternatively, the underlying layer 402 may be substantially similar to the semiconductor layer 102 in FIG. 1 and includes at least one conductive feature, such as a portion of a transistor, like one of a gate terminal, a source terminal, or a gate terminal. In one embodiment, the underlying layer 402 is a silicon substrate. The underlying layer 402 may comprise another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the underlying layer 402 is a semiconductor on insulator (SOI).

An etch stop layer 406 may be formed on the underlying layer 402. In addition to signaling the termination point of an etching process, the etch stop layer 406 protects any underlying layer(s) during the etching process. Materials for the etch stop layer 406 may include aluminum nitride, aluminum oxide, silicon nitride, silicon oxynitride, silicon carbide, titanium nitride, other suitable materials, or combination thereof. Alternatively, the etch stop layer 406 may be formed by depositing and annealing a metal oxide material, which may include hafnium, hafnium oxide (HfO$_2$), or aluminum. The etch stop layer 406 may comprise a plurality of layers. In some embodiments, the etch stop layer 406 includes two sub-layers, such as an aluminum oxide layer stacked above an aluminum nitride layer, or alternatively, an aluminum nitride layer stacked above an aluminum oxide layer. The aluminum oxide layer may be thicker than the aluminum nitride layer, such as about 50% thicker. In a specific example, the aluminum nitride layer is about 2 nm thick and the aluminum oxide layer is about 3 nm thick. In the illustrated embodiment, the etch stop layer 406 has three sub-layers, namely sub-layers 406a, 406b, and 406c. The middle sub-layer 406b may include oxygen-doped silicon carbide (ODC). The sub-layer 406a may be an aluminum oxide layer and the sub-layer 406c may be an aluminum nitride layer. Alternatively, the sub-layer 406a may be an aluminum nitride layer and the sub-layer 406b may be an aluminum oxide layer. The etch stop layer 406 may be formed by any suitable process including chemical vapor deposition (CVD), low pressure CVD (LPCVD), high-density plasma CVD (HDP-CVD), physical vapor deposition (PVD), atomic-layer deposition (ALD), and/or other suitable deposition processes. The etch stop layer 406 may be formed to a thickness from about 1 nm to about 10 nm, such as about 5 nm.

A low-k dielectric layer 410 may be formed on the etch stop layer 406. The low-k dielectric layer 410 may comprise a material, such as an oxide, SiO$_2$, borophosphosilicate glass (BPSG), TEOS, spin-on glass (SOG), undoped silicate glass (USG), fluorinated silicate glass (FSG), high-density plasma (HDP) oxide, or plasma-enhanced TEOS (PETEOS). The low-k dielectric material may comprise a SiOC-based spin-on material that can be applied to or deposited by a spin-on method, such as spin coating. Alternatively, the low-k dielectric material may be deposited by a chemical vapor deposition (CVD). The low-k dielectric layer 410 may be formed to a thickness from about 15 nm to about 200 nm, such as about 52 nm.

In the present embodiment, a nitrogen free anti-reflective layer (NFARL) 414, which may also be referred to as an anti-reflective coating (ARC) layer 414, is formed above the low-k dielectric layer 410. The ARC layer 414 functions to suppress radiation reflections by the underlying layer(s) during photolithography. The ARC layer 414 may be formed to any suitable thickness (e.g., about 30 nm) and by any suitable process including CVD, LPCVD, HDP-CVD, PVD, ALD, and/or other suitable deposition processes. Although not shown, any number of intervening layers may be formed between the low-k dielectric layer 410 and the ARC layer 414.

A hard mask layer 418 may be formed on the ARC layer 414. In the illustrated embodiment, the hard mask layer 418 is a metal-hard-mask (MHM) layer. The MHM layer 418 may comprise TiN material. The MHM layer 418 may comprise other material such as Ti, Ta, W, TaN or WN. The MHM layer may be used to control the size of the trench or via openings. The MHM layer 418 may be formed to a thickness from about 18 nm to about 36 nm. The MHM layer 418 may be formed by any suitable process including CVD, LPCVD, HDP-CVD, PVD, ALD, and/or other suitable deposition processes.

Figure 5:
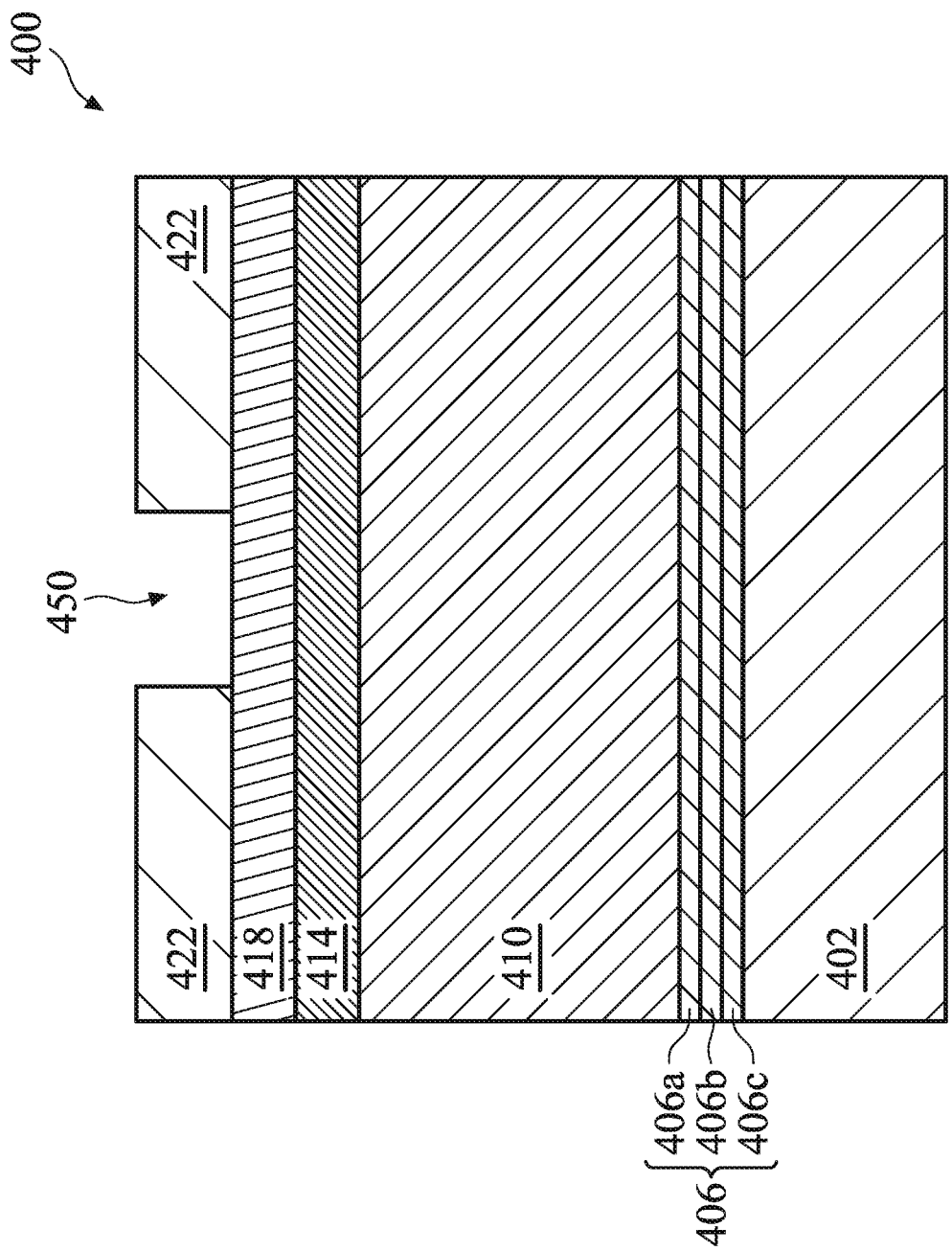

At operation 304, the method 300 (FIG. 3) forms a photoresist layer 422 over the hard mask layer 418 and patterns the photoresist layer 422 (FIG. 5). In an embodiment, the photoresist layer 422 is spin coated on the hard mask layer 418, and is then patterned by exposure, bake, developing, and/or other photolithographic processes to provide an opening 450 in the photoresist layer 422 exposing the hard mask layer 418. In a specific embodiment, an exemplary photoresist includes a photosensitive material sensitive to radiation such as UV light, deep ultraviolet (DUV) radiation, and/or EUV radiation. A lithographic exposure is performed on the device 400 that exposes selected regions of the photoresist 422 to radiation. After exposure, a developer is applied to the photoresist 422. The developer dissolves or otherwise removes either the exposed regions (in the case of a positive resist development process) or the unexposed regions (in the case of a negative resist development process) of the photoresist 422. Suitable positive developers include TMAH (tetramethyl ammonium hydroxide), KOH, and NaOH, and suitable negative developers include solvents such as n-butyl acetate, ethanol, hexane, benzene, and toluene.

Figure 6:
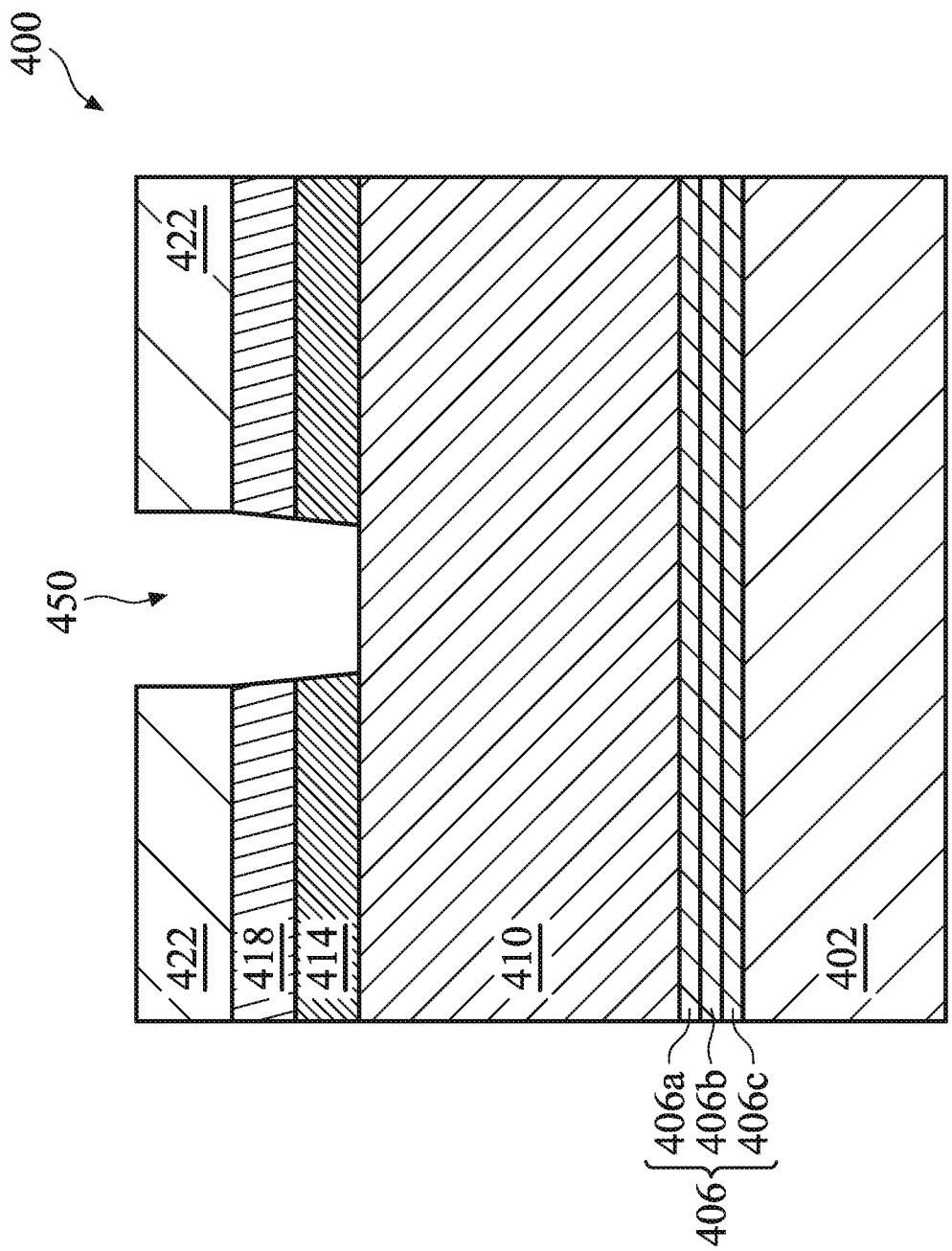

At operation 306, the method 300 (FIG. 3) proceeds to patterning the hard mask layer 418 and the ARC layer 414 (FIG. 6). The portions of the hard mask layer 418 exposed in the opening 450 may be removed by an etching process, such as wet etching, dry etching, Reactive Ion Etching (RIE), ashing, and/or other suitable etching methods. Then, the patterned hard mask layer 418 is used as an etching mask to etch the ARC layer 414. In an embodiment, the ARC layer 414 is etched using an RIE method. The opening 450 extends downward to expose the low-k dielectric layer 410. In some other embodiments, the hard mask layer 418 and the ARC layer 414 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the hard mask layer 418 and patterned using a photolithography process. Spacers are formed alongside the patterned sacrificial layer using a self-aligned process. The sacrificial layer is then removed, and the remaining spacers, or mandrels, may then be used to pattern the hard mask layer 418 to form openings. Optionally, after etching the ARC layer 414, the photoresist layer 422 and the hard mask layer 418 may be removed.

Figure 7:
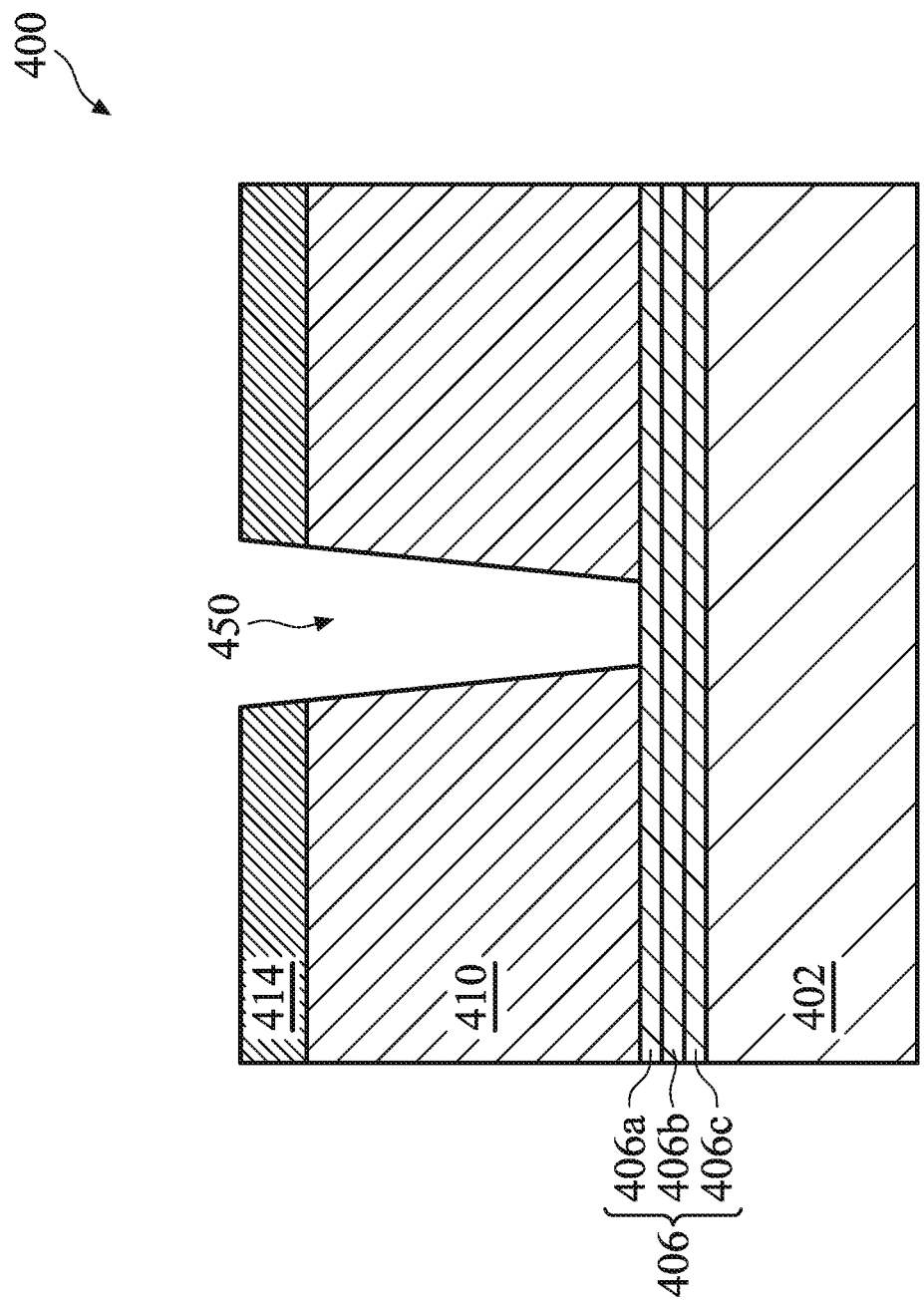

At operation 308, the method 300 (FIG. 3) etches the low-k dielectric layer 410 to form the upper portion of the via hole 450 (FIG. 7). The upper portion of the via hole 450 is etched into the low-k dielectric layer 410 by extending downwardly the opening defined in the patterned ARC layer 414. In various embodiments, the etching of the low-k dielectric layer 410 is an anisotropic etch (e.g., dry etch or RIE etch) to provide smooth tapered slope or substantially vertical sidewalls for the via hole 450. For example, an anisotropic etching process may implement an oxygen-containing gas, a fluorine-containing gas (e.g., $CF_4$, $SF_6$, $NF_3$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. In some embodiments, the etching process employs a setting with pressure ranging from about 5 mtorr to about 80 mtorr, a temperature ranging from about 20 degrees to about 100 degrees, a power ranging from about 100 W to about 1500 W, and a bias power ranging from about 5 W to about 500 W. The layer 406 functions as an etch stop layer for the operation 308. Hence, the etch chemistry or etch process used for etching the low-k dielectric layer 410 does not (or insignificantly) etch the material compositions in the etch stop layer 406. In some embodiments, the etch stop layer 406 may be slightly etched by the operation 308 to ensure that the dielectric layer 410 is completely etched through.

Figure 8A:
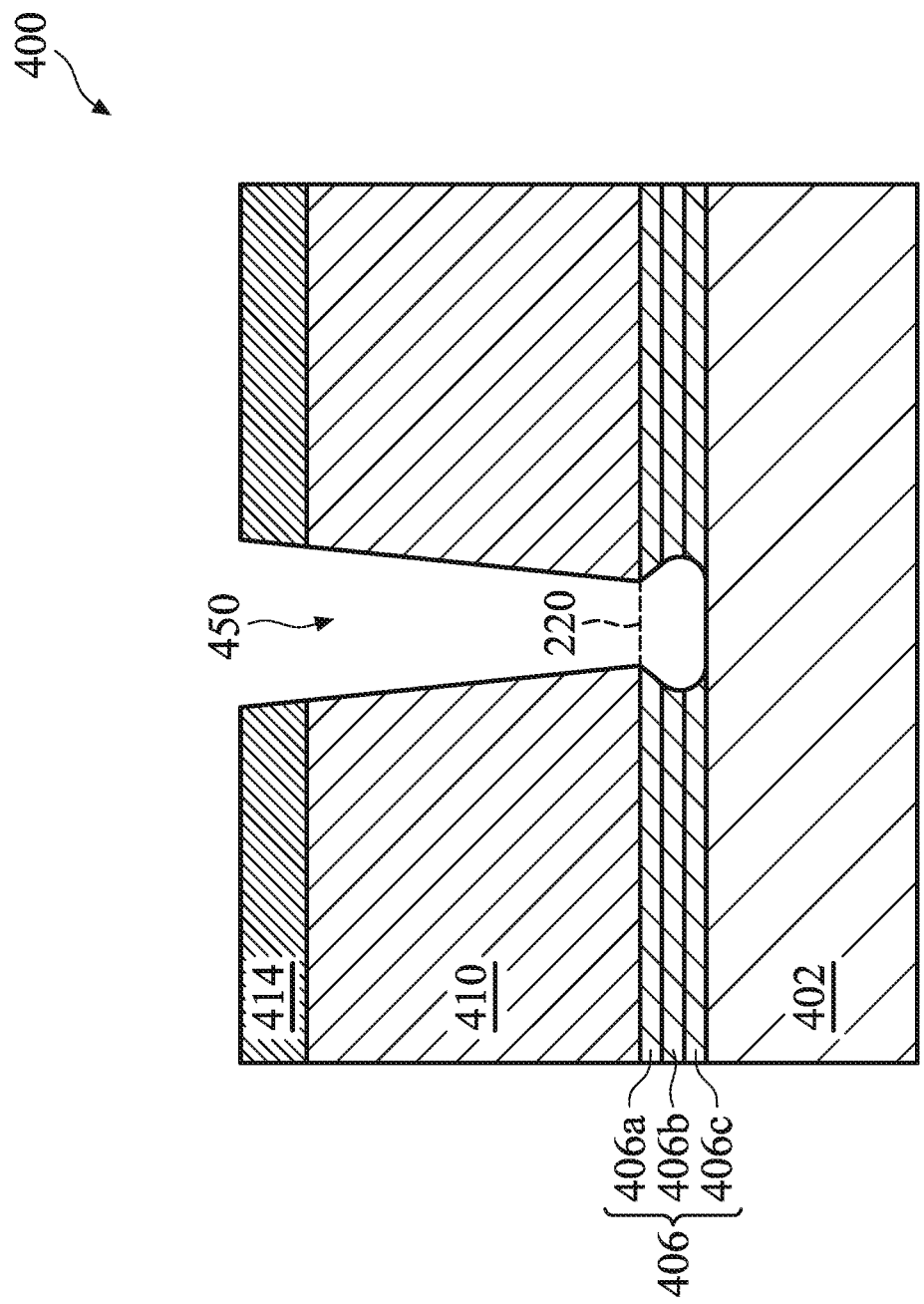
Figure 8B:
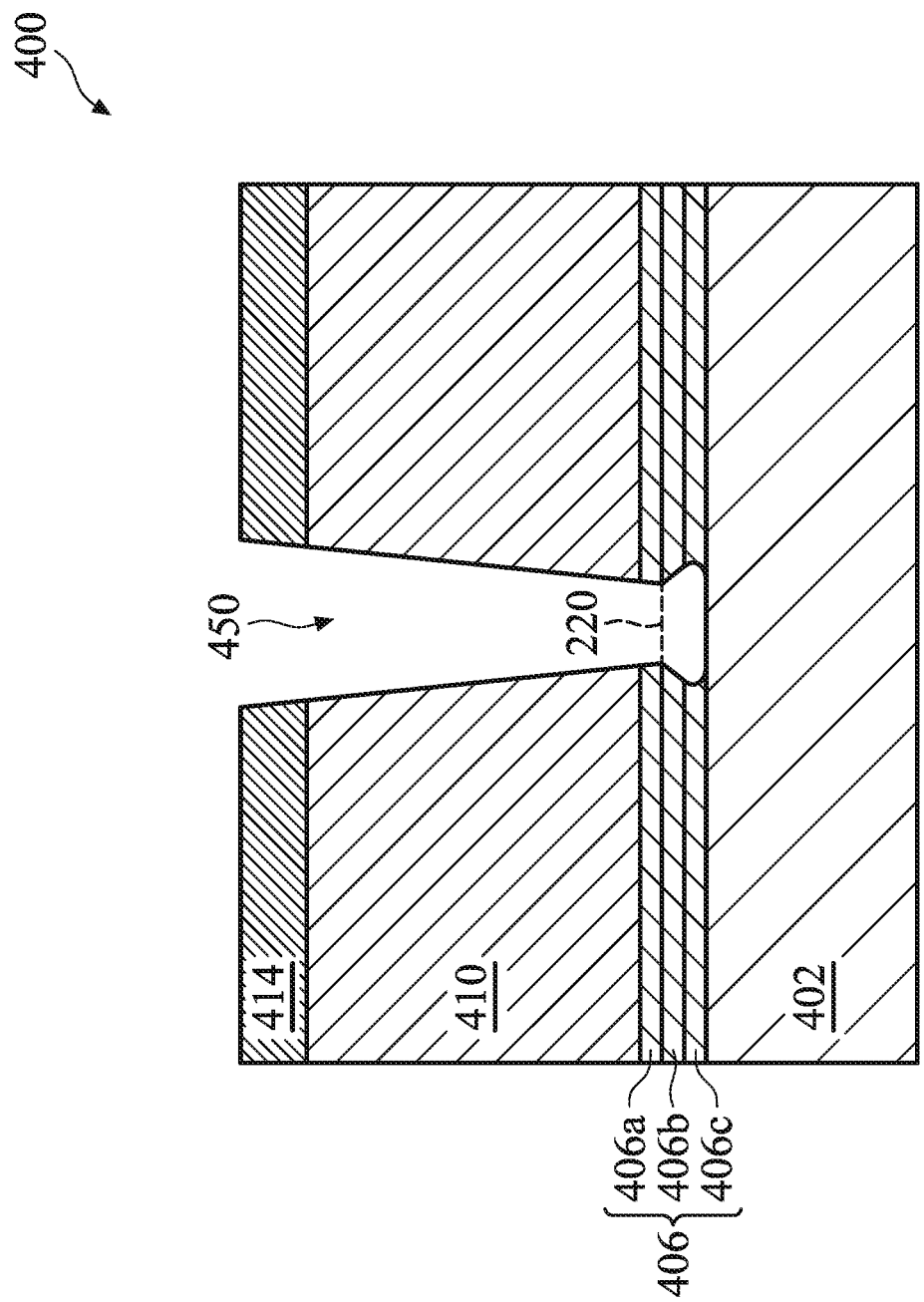
Figure 8C:
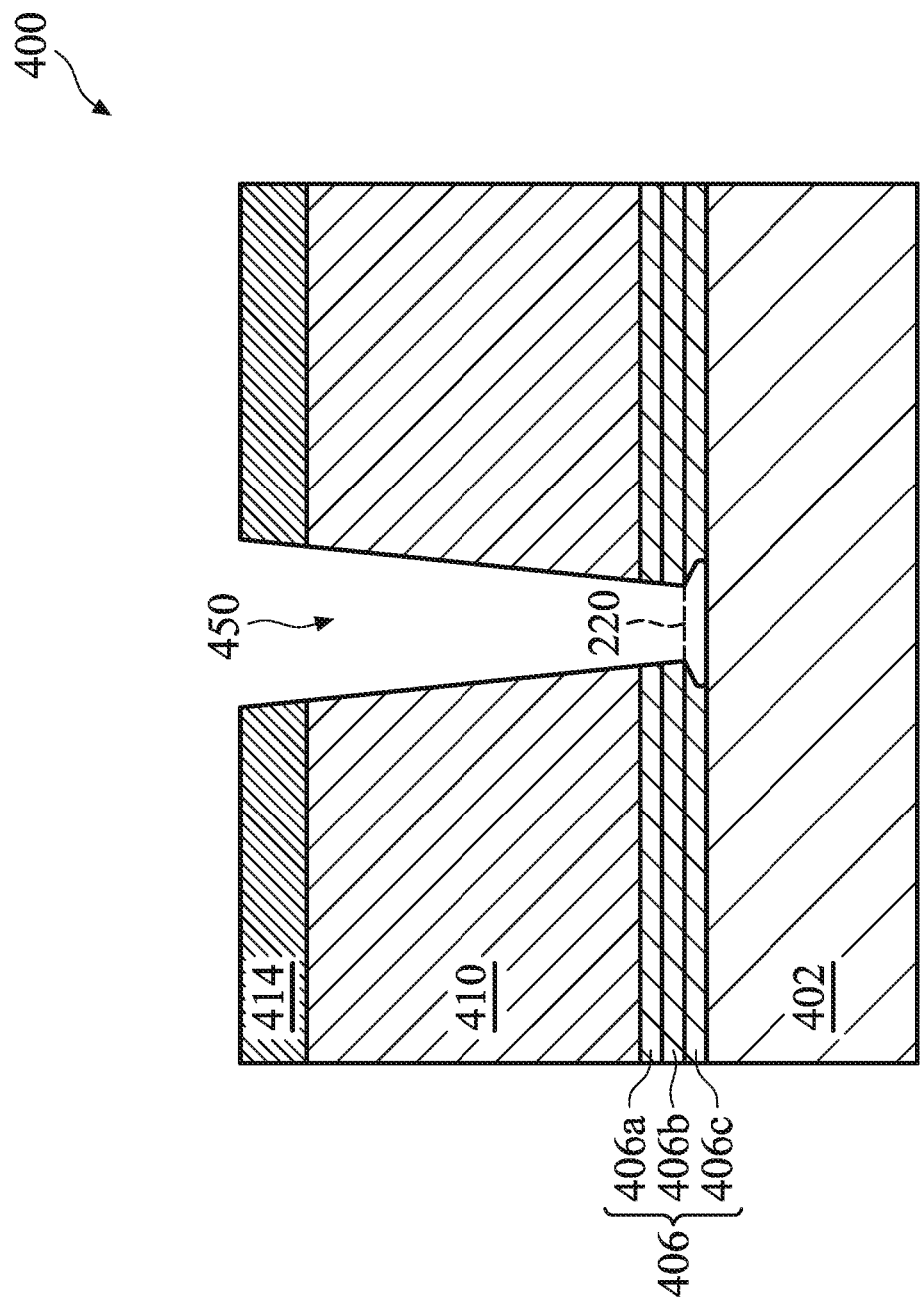

At operation 310, the method 300 (FIG. 3) etches the etch stop layer 406 to form the lower portion of the via hole 450 (FIGS. 8A, 8B, and 8C). Referring to FIG. 8A, the etch stop layer 406 is etched by extending downwardly the partially formed via hole 450 in the low-k dielectric layer 410. The etch may be an isotropic etch or a lateral etch so that a cross-sectional area of the lower portion of the via hole 450 in the etch stop layer 406 is larger than the smallest cross-sectional area of the upper portion of the via hole 450 in the low-k dielectric layer 410. In the illustrated embodiment, operation 310 includes a wet etching process controlled by timing to enlarge the bottom footing profile of the via hole 450. The wet etching processes may include multiple wet etching steps with different etching chemistries, each targeting a particular sub-layer in the etch stop layer 406. An etch chemistry for etching the etch stop layer 406 may include diluted hydrofluoric acid (DHF); potassium hydroxide (KOH) solution; ammonia; a solution containing hydrofluoric acid (HF), nitric acid (HNO3), and/or acetic acid (CH3COOH); or other suitable wet etchant. As another example, a wet chemistry cleaning solution including sulfuric peroxide mix (SPM), ozonated DI water (DI-O3), ammonia-peroxide mixture (APM), or combinations thereof, may be used, for example, to etch the etch stop layer 406. As shown in FIG. 8A, the cross-sectional plane 220 where the via hole 450 has the smallest cross-sectional area may be substantially coplanar with the top surface of the etch stop layer 406.

As shown in FIGS. 8B and 8C, alternatively, the operation 310 may include an anisotropic etching targeting one or two topmost sub-layers of the etch stop layer 406, followed by an isotropic or lateral etching to enlarge the bottom footing profile of the via hole 450. Due to the anisotropic etching, the tapered slope profile in the low-k dielectric layer 410 continuously extends into the sub-layer 406a (FIG. 8B) or sub-layers 406a and 406b (FIG. 8C). The cross-sectional plane 220 where the via hole 450 has the smallest cross-sectional area may be lower than the embodiment shown in FIG. 8A. In FIG. 8B, the cross-sectional plane 220 is substantially coplanar with the top surface of the sub-layer 406b. In FIG. 8C, the cross-sectional plane 220 is substantially coplanar with the top surface of the sub-layer 406c.

Figure 9:
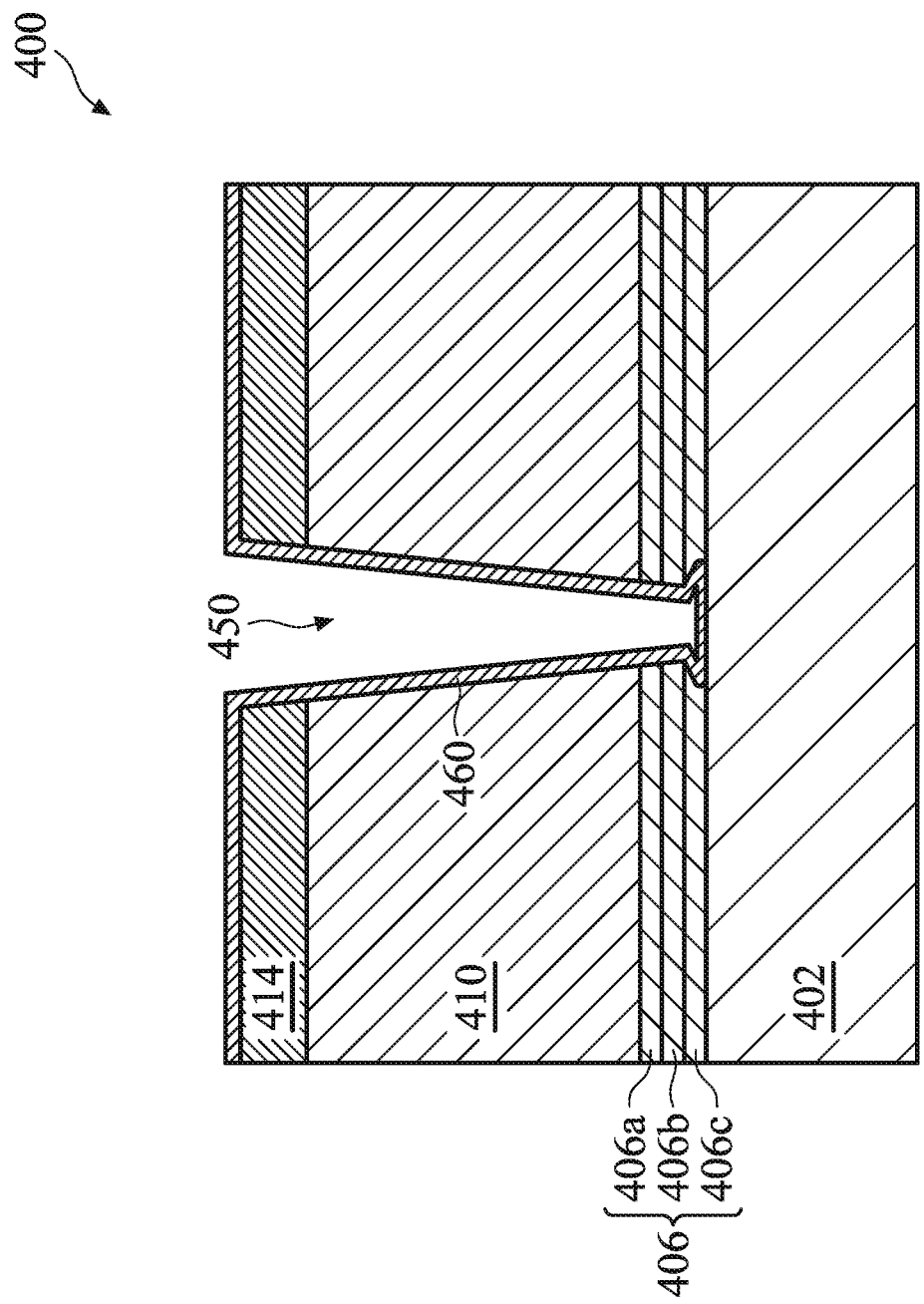
Figure 10:
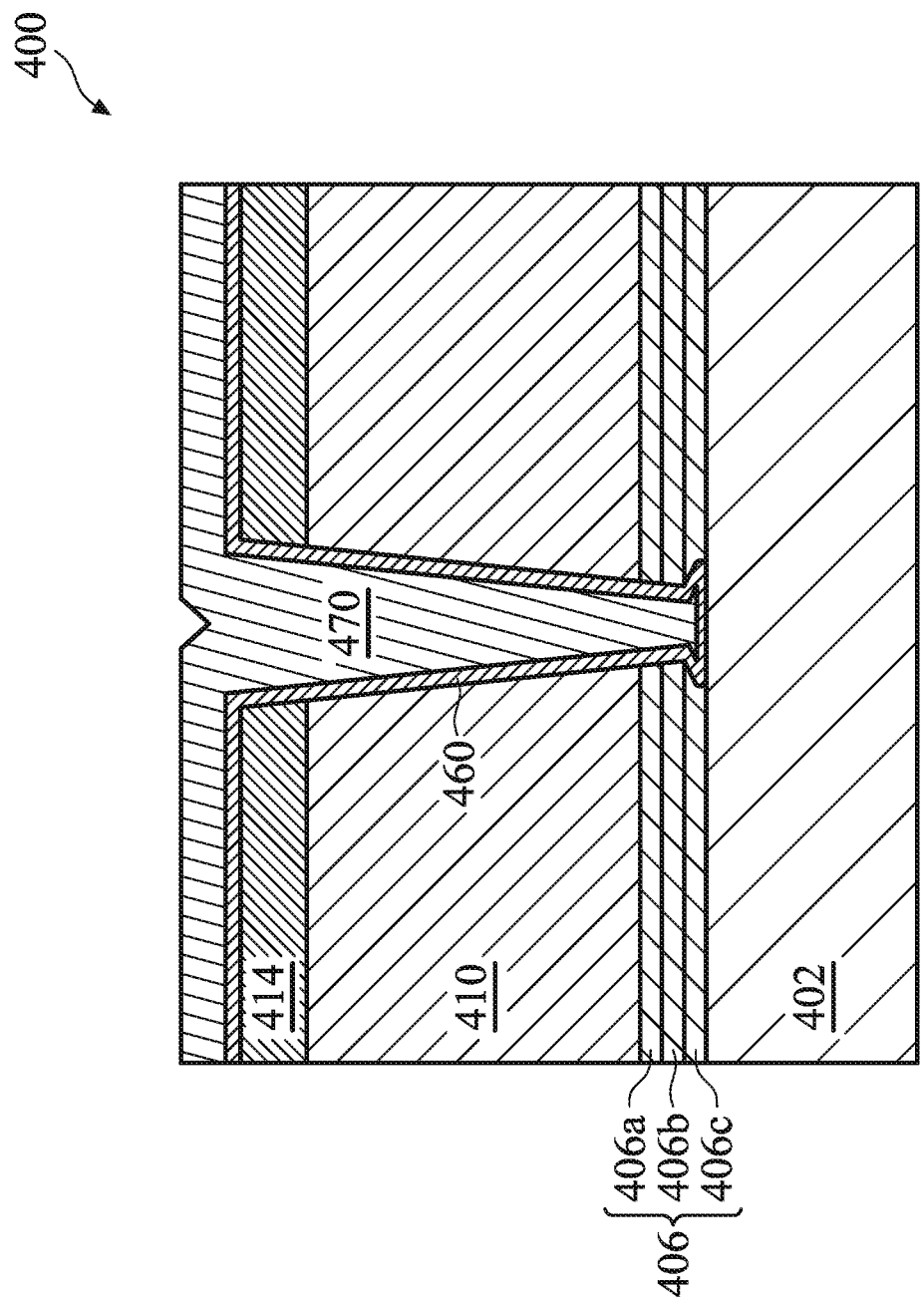
Figure 11:
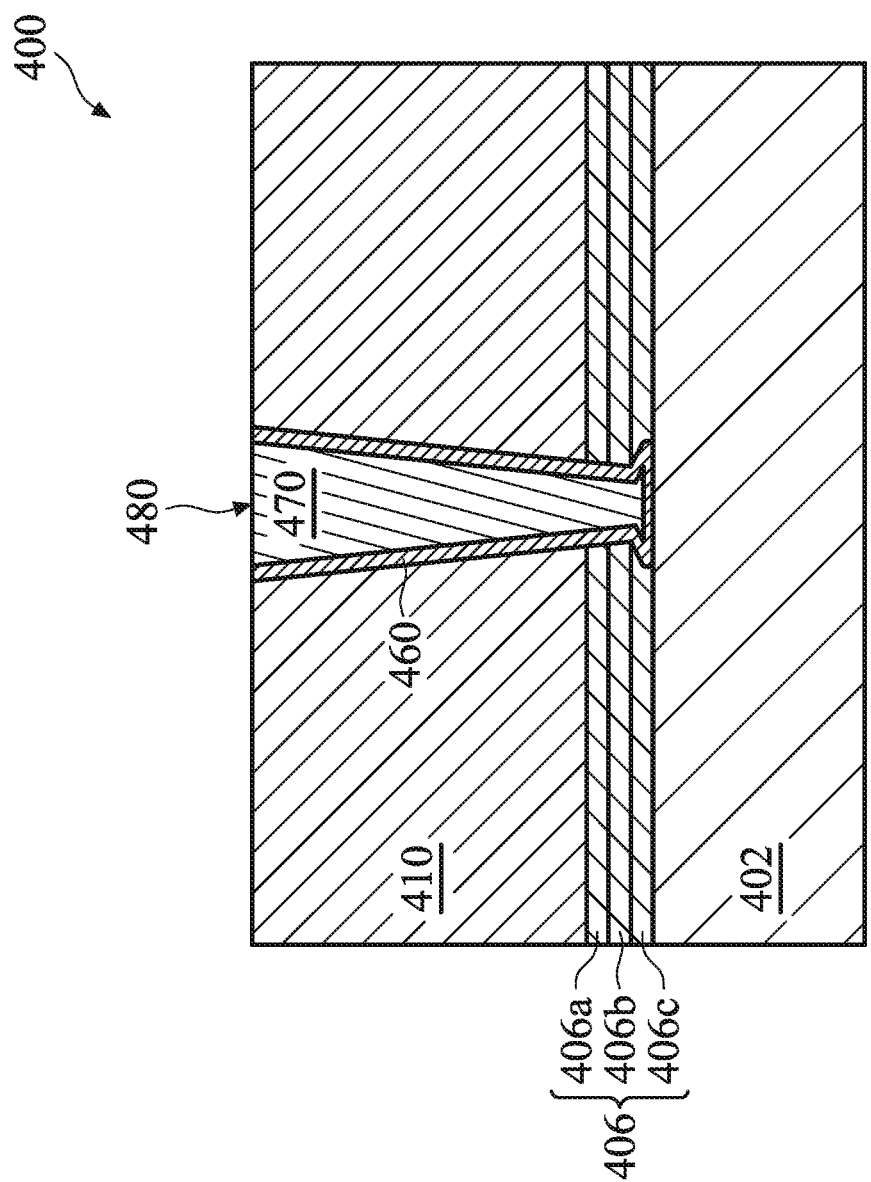
Figure 12:
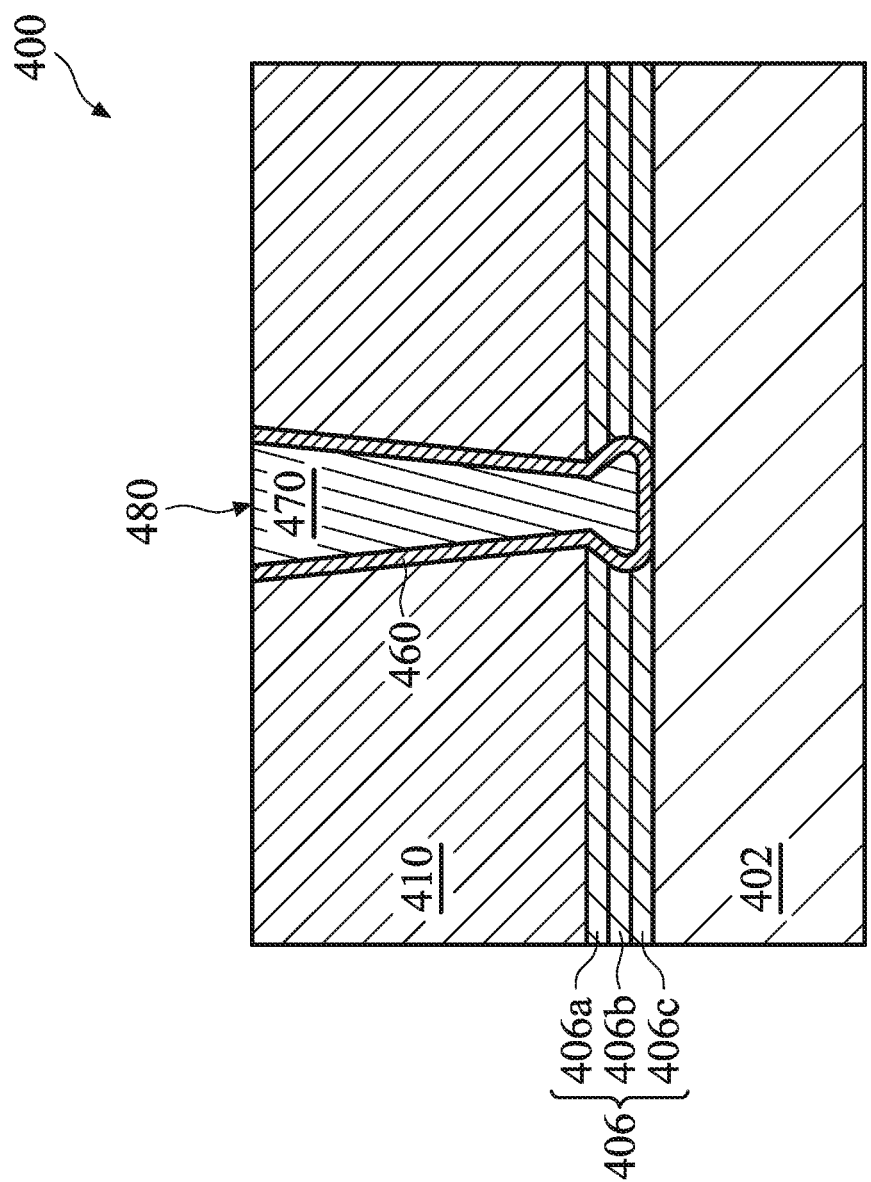
Figure 13:
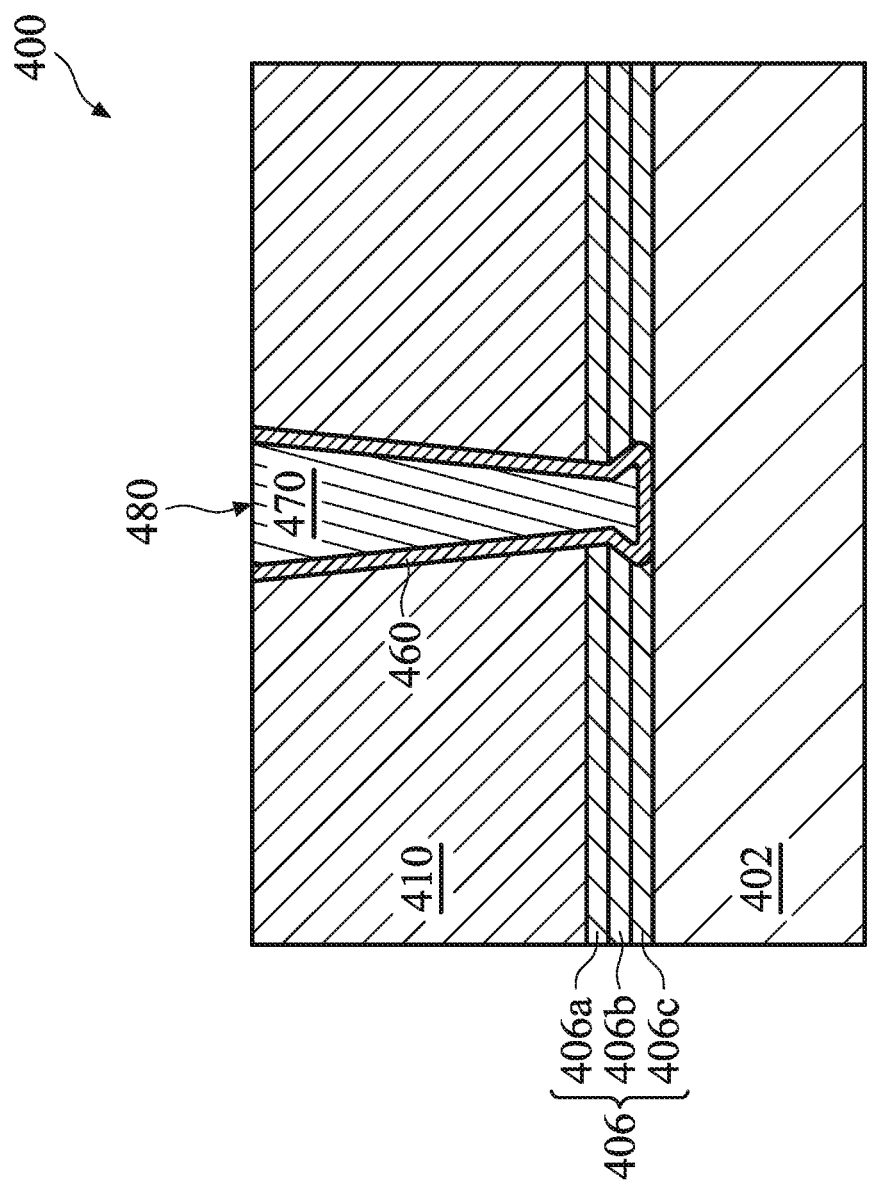

At operation 312, the method 300 (FIG. 3) forms a via in the via hole 450. Referring now to FIG. 9 (which follows the embodiment shown in FIG. 8C), a barrier layer 460 is formed inside the via hole 450. The barrier layer 460 substantially covers the low-k dielectric layer 410 and the etch stop layer 406 exposed in the via hole 450. The barrier layer 460 may be deposited with a CVD, PVD, or ALD process. In some embodiments, the barrier layer 460 may be formed by using one or more PVD steps combined with one or more etch steps. The barrier layer 460 may include any suitable barrier layer material, such as Ti, Ta, TiN, TaN, alloys thereof, or combinations thereof. A seed layer (not shown) may be subsequently deposited on the barrier layer 450. As shown in FIG. 10, a conductive material 470 is formed in the via hole 450 over the barrier layer 460. The forming of the conductive material 470 may include using damascene and/or dual damascene processes. This conductive material 470 may be any suitable conductive material, including tungsten, copper, aluminum, doped polysilicon, titanium, tantalum, gold, alloys thereof, composites thereof, or combinations thereof. Next, as shown in FIG. 11, a chemical mechanical polish (CMP) and/or electrochemical mechanical polish (ECMP) process may be used to planarize the device 400, remove any excess conductive material 470, remove any excess portions of the barrier layer 460, and remove the ARC layers 414. The resulting structure includes the via 480 as shown in FIG. 11, which may be substantially the same as the via 202 shown in FIG. 2. FIGS. 12 and 13 illustrate embodiments of the device 400 following those shown in FIGS. 8A and 8B, respectively, and after the operation 312 has been performed thereon.

Although not intended to be limiting, one or more embodiments of the present disclosure provide many benefits to a semiconductor device and the formation thereof, including via or trench structures. For example, the bottom footing profile of a via structure has been enlarged to reduce via resistance when current flow through it. Further, the enlarged bottom footing profile helps to increase the mechanical strength of via landing due to the increased bottom contact area. In addition, the enlarged bottom footing profile helps to reduce unwanted causing of open circuit between a via and other conductive features to land on. Also, the disclosed methods can be easily integrated into existing semiconductor manufacturing processes.

In one exemplary aspect, the present disclosure is directed to a device. The device includes a substrate; a first dielectric layer over the substrate; a second dielectric layer over the first dielectric layer, the first and second dielectric layers having different material compositions; and a via extending through the second and first dielectric layers, the via having an upper portion surrounded by the second dielectric layer and a lower portion surrounded by the first dielectric layer, the lower portion of the via having a bottom-surface area that is larger than a smallest cross-sectional area of the upper portion of the via. In an embodiment, the first dielectric layer includes a first sub-layer having a first aluminum-containing material and a second sub-layer having a second aluminum-containing material, the first and second aluminum-containing materials being different. In an embodiment, the first dielectric layer further includes a third sub-layer having oxygen-doped silicon carbide, and wherein the third sub-layer is interposed between the first and second sub-layers. In an embodiment, the first aluminum-containing material includes aluminum nitride and the second aluminum-containing material includes aluminum oxide. In an embodiment, the first sub-layer is thinner than the second sub-layer. In an embodiment, the first sub-layer is in physical contact with the substrate. In an embodiment, the upper portion of the via has a tapered sidewall. In an embodiment, the lower portion of the via has a rounded corner. In an embodiment, the via has a smallest cross-sectional area located below a top surface of the first dielectric layer. In an embodiment, at least part of the lower portion of the via has a larger cross-sectional area than the bottom-surface area of the lower portion of the via. In an embodiment, a ratio between a height of the lower portion of the via and a height of the upper portion of the via ranges from about 5% to about 10%. In an embodiment, the via has a height ranging from about 15 nm to about 200 nm.

In another exemplary aspect, the present disclosure is directed to an integrated circuit structure. The integrated circuit structure includes a substrate; an etch stop layer over the substrate; a low-k dielectric layer over the etch stop layer; and a conductive feature extending through the low-k dielectric layer and the etch stop layer, wherein the conductive feature has an upper portion in the low-k dielectric layer and a lower portion in the etch stop layer, wherein the lower portion has a largest cross-sectional area located below a top surface of the etch stop layer. In an embodiment, the upper portion of the conductive feature has a tapered sidewall and the lower portion of the conductive feature has a rounded corner. In an embodiment, the substrate includes a metal trace, and wherein the conductive feature is in physical contact with the metal trace. In an embodiment, the substrate includes a transistor, and wherein the conductive feature is in physical contact with one of source, drain, and gate terminals of the transistor. In an embodiment, the etch stop layer includes one or more of: aluminum nitride, aluminum oxide, and silicon carbide.

In yet another exemplary aspect, the present disclosure is directed to a method of fabricating an integrated circuit. The method includes depositing a buffer layer over a substrate; depositing a dielectric layer over the buffer layer; removing a portion of the dielectric layer to form an opening; etching the buffer layer through the opening, thereby extending the opening through the buffer layer and exposing a surface of the substrate in the opening, wherein the etching of the buffer layer includes an isotropic etching or a lateral etching; and filling the opening with a conductive feature. In an embodiment, after the etching of the buffer layer, the opening has a bottom area that is larger than a cross-sectional area of a portion of the opening surrounded by the dielectric layer. In an embodiment, the conductive feature includes a barrier layer covering sidewalls of the opening and a conductive layer over the barrier layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a substrate, wherein the substrate includes a conductive feature in a top portion of the substrate;
   forming a buffer layer over the substrate;
   forming a dielectric layer over the buffer layer;
   performing a first etching process to form an opening in the dielectric layer, thereby exposing a top surface of the buffer layer; and
   performing a second etching process to extend the opening downwardly into the buffer layer, thereby exposing a top surface of the conductive feature, wherein the performing of the second etching process includes laterally enlarging a footing profile of the opening
   wherein the performing of the first etching process forms sidewalls of the opening tapered inwardly towards a center of the opening, and the performing of the second etching process extends the sidewalls of the opening outwardly away from the center of the opening.

2. The method of claim 1, further comprising:
   filling the opening with a conductive material, such that the conductive material is in physical contact with the top surface of the conductive feature.

3. The method of claim 1, wherein the first etching process includes an anisotropic etching and the second etching process includes an isotropic etching or a lateral etching.

4. The method of claim 1, wherein the first etching process includes a reactive ion etching and the second etching process includes a wet etching.

5. The method of claim 1, wherein the forming of the buffer layer includes forming at least a top sub-layer and a bottom sub-layer of different material compositions, and the second etching process includes an anisotropic etching to extend the opening downwardly through the top sub-layer followed by an isotropic etching or a lateral etching to laterally enlarge the footing profile of the opening in the bottom sub-layer.

6. The method of claim 5, wherein the forming of the buffer layer further includes forming a middle sub-layer sandwiched by the top and bottom sub-layers.

7. The method of claim 1, wherein the performing of the second etching process forms a rounded corner at a bottom portion of the opening.

8. The method of claim 1, wherein after the performing of the second etching process, a cross section of the opening that has a smallest cross-sectional area is located below the top surface of the buffer layer and above the top surface of the conductive feature.

9. The method of claim 1, wherein after the performing of the second etching process, a cross section of the opening that has a smallest cross-sectional area is coplanar with the top surface of the buffer layer.

10. The method of claim 1, wherein after the performing of the second etching process, the opening has a bottom surface larger than a top surface.

11. A method of forming a semiconductor device, comprising:
   forming a first etch stop layer over a substrate;
   forming a second etch stop layer over the first etch stop layer, wherein the second and first etch stop layers include different material compositions;
   forming a low-k dielectric layer over the second etch stop layer; and
   forming a via extending through the low-k dielectric layer, the second etch stop layer, and the first etch stop layer, wherein the via has a top sidewall tapered inwardly towards a center of the via and a bottom sidewall tapered outwardly away from the center of the via, wherein the top sidewall and the bottom sidewall intersect below a top surface of the second etch stop layer.

12. The method of claim 11, wherein the top sidewall and the bottom sidewall intersect at a top surface of the first etch stop layer.

13. The method of claim 11, wherein each of the first and second etch stop layers is an aluminum-containing layer.

14. The method of claim 13, further comprising:
   forming a silicon carbide layer between the first and second etch stop layers.

15. The method of claim 11, wherein the forming of the via includes:
   etching the low-k dielectric layer, thereby forming a via hole;
   etching the second etch stop layer, thereby extending the via hole downwardly through the second etch stop layer;
   etching the first etch stop layer, thereby laterally enlarging a bottom portion of the via hole in the first etch stop layer; and
   filling the via hole with a conductive material.

16. The method of claim 15, wherein each of the etching of the low-k dielectric layer and the etching of the second etch stop layer includes an anisotropic etching, and wherein the etching of the first etch stop layer includes an isotropic etching or a lateral etching.

17. A method of fabricating an integrated circuit, comprising:
   depositing a buffer layer over a substrate;
   depositing a dielectric layer over the buffer layer;
   removing a portion of the dielectric layer to form an opening;
   etching the buffer layer through the opening, thereby extending the opening through the buffer layer and exposing a top surface of the substrate in the opening, wherein the etching of the buffer layer includes an isotropic etching or a lateral etching, and wherein after the etching of the buffer layer, a cross section of the opening that has a smallest cross-sectional area is located below a top surface of the buffer layer and above the top surface of the substrate; and
   filling the opening with a conductive feature.

18. The method of claim 17, wherein after the etching of the buffer layer, the opening has a bottom area that is larger than a cross-sectional area of a portion of the opening surrounded by the dielectric layer.

19. The method of claim 17, wherein the conductive feature includes a barrier layer covering sidewalls of the opening and a conductive layer over the barrier layer.

20. The method of claim 17, wherein the depositing of the buffer layer includes depositing a bottom sub-layer over the substrate and depositing a top sub-layer over the bottom sub-layer, wherein the bottom and top sub-layers include different material compositions.

* * * * *